(12) United States Patent
Baek et al.

(10) Patent No.: US 11,817,863 B2
(45) Date of Patent: Nov. 14, 2023

(54) FRACTIONAL-N SUB-SAMPLING PHASE LOCKED LOOP USING PHASE ROTATOR

(71) Applicant: CHUNG ANG UNIVERSITY INDUSTRY ACADEMIC COOPERATION FOUNDATION, Seoul (KR)

(72) Inventors: Donghyun Baek, Seoul (KR); Gwang Sub Kim, Seoul (KR)

(73) Assignee: CHUNG ANG UNIVERSITY INDUSTRY ACADEMIC COOPERATION FOUNDATION, Seoul (KR)

( * ) Notice: Subject to any disclaimer, the term of this patent is extended or adjusted under 35 U.S.C. 154(b) by 0 days.

(21) Appl. No.: 17/870,362

(22) Filed: Jul. 21, 2022

(65) Prior Publication Data
US 2023/0029340 A1  Jan. 26, 2023

(30) Foreign Application Priority Data
Jul. 21, 2021  (KR) .......................... 10-2021-0095850

(51) Int. Cl.
| H03L 7/081 | (2006.01) |
| H03L 7/099 | (2006.01) |
| H03L 7/093 | (2006.01) |
| H03L 7/087 | (2006.01) |
| H03L 7/18 | (2006.01) |
| H03L 7/091 | (2006.01) |

(52) U.S. Cl.
CPC .............. *H03L 7/081* (2013.01); *H03L 7/087* (2013.01); *H03L 7/091* (2013.01); *H03L 7/093* (2013.01); *H03L 7/099* (2013.01); *H03L 7/18* (2013.01)

(58) Field of Classification Search
CPC ......... H03L 7/099; H03L 7/093; H03L 7/081; H03L 7/087; H03L 7/091; H03L 7/18
USPC .............................................. 331/1 A, 16, 34
See application file for complete search history.

(56) References Cited

U.S. PATENT DOCUMENTS 10,224,942 B2   3/2019  Anders Jakobsson
2013/0271186 A1* 10/2013  Hossain ................. H03L 7/081
                                                             327/107

FOREIGN PATENT DOCUMENTS

| JP | 2005-502241 A | 1/2005 |
| KR | 10-2001-0015841 A | 2/2001 |
| KR | 10-1780630 B1 | 10/2017 |

(Continued)

OTHER PUBLICATIONS

Shinwoong Kim, "Design of Fractional-N Digital PLL for IoT Application", j.inst.Korean.electr.electron.eng.vol. 23, No. 3,800-804,Sep. 2019, http://dx.doi.org/10.7471/ikeee.2019.23.3.800.

(Continued)

*Primary Examiner* — Arnold M Kinkead
(74) *Attorney, Agent, or Firm* — Bridgeway IP Law Group, PLLC; Sang Ho Lee; Hyun Woo Shin

(57) ABSTRACT

According to an exemplary embodiment of the present disclosure, a fractional-N sub-sampling phase locked loop using a phase rotator includes a frequency locked loop which is locked at a fractional-N frequency using a delta-signal modulator and a sub-sampling phase locked loop which locks a phase to a fractional multiple using a phase rotator, and the phase rotator applies a fractional multiple to a phase of a signal output from the oscillator.

7 Claims, 7 Drawing Sheets

(56) References Cited

FOREIGN PATENT DOCUMENTS

KR      10-1813926 B1     1/2018

OTHER PUBLICATIONS

Sun-Cheol Kim et al., "Fractional-N PLL (Phase-Locked Loop) Frequency Synthesizer Design", The Institute of Electronics Engineers of Korea—Telecommunications 42(7), Jul. 2005, 35-40(6 pages).

\* cited by examiner

FRACTIONAL-N SUB-SAMPLING PHASE LOCKED LOOP USING PHASE ROTATOR

CROSS-REFERENCE TO RELATED APPLICATIONS

This application claims the priority of Korean Patent Application No. 10-2021-0095850 filed on Jul. 21, 2021, in the Korean Intellectual Property Office, the disclosure of which is incorporated herein by reference.

BACKGROUND

Field

The present disclosure relates to a fractional-N sub-sampling phase locked loop using a phase rotator.

Description of the Related Art

A phase-locked loop (PLL) is a frequency synthesizer which is used as a local oscillator in various systems using a clock timing. In the related, even though it is used to output integer-N frequency, in recent years, as a local oscillator that finely adjust an output frequency is required for a communication system or a radar sensor system, a fractional-N phase locked loop is required.

In order to make a fractional multiple, a general fractional-N phase locked loop circuit uses a delta-sigma modulator to randomly shake a divider value and at this time, a specific noise is generated. This noise is called a delta-sigma noise. The delta-sigma noise is present in a high frequency band with respect to a carrier frequency, in the total noises, and has a very dominant characteristic as compared with the other noises. The phase locked loop needs to have a low total noise over a broad bandwidth, but this performance is limited due to the high frequency delta-sigma noise. Further, in order to increase an operation speed of the phase locked loop, a broad bandwidth is required, but for this reason, this performance is also limited.

SUMMARY

As mentioned above, an object is to provide a fractional-N sub-sampling phase locked loop having a small delta-signal noise and a broad bandwidth.

According to an aspect of the present disclosure, a fractional-N sub-sampling phase locked loop using a phase rotator includes: a frequency locked loop which is locked at a fractional-N frequency using a first delta-signal modulator; and a sub-sampling phase locked loop which locks a phase to a fractional-N phase using a phase rotator, and the phase rotator applies a fractional multiple to a phase of the signal output from the oscillator.

According to an exemplary embodiment, the frequency locked loop includes: a phase-frequency detector (PFD) which generates an up-signal UP and a down-signal DOWN based on a phase difference between an input signal Fref and a feedback signal Fdiv; a charge pump (CP) which generates a charge pump output signal based on the up-signal UP and the down-signal DOWN; a loop filter (LF) which changes the charge pump output signal into a voltage; a voltage controlled oscillator (VCO) which receives an output of the loop filter (LF); and a fractional N-divider which applies a fractional multiple to the output of the voltage controlled oscillator (VCO) to output a feedback signal Fdiv.

According to an exemplary embodiment, the phase locked loop includes: a sub-sampling block (SSblock) which samples a fast oscillator output signal into a slow input signal and then calculates a phase difference from the input signal based on the input signal (Fref) and a signal divided from the phase rotator; a loop filter (LF) which changes the charge pump output signal into a voltage; and a voltage controlled oscillator (VCO) which receives an output of the loop filter (LF).

According to an exemplary embodiment, the sub-sampling block (SSblock) includes: a sub-sampling phase detector (SSPD) which samples a fast oscillator output signal into a slow input signal and then calculates a phase difference from the input signal as a DC value based on the input signal (Fret) and a signal divided from the phase rotator; a sub-sampling charge pump (SSCP) which converts a phase difference of the DC calculated from the sub-sampling phase detector to transmit the phase difference to the voltage controlled oscillator; and a pulser which controls an operating time of the sub-sampling charge pump to adjust a roof gain.

According to an exemplary embodiment, the phase locked loop and the frequency locked loop commonly include a current mode logic (CML) to lower an output frequency of the voltage controlled oscillator (VCO).

According to an exemplary embodiment, the first delta-sigma modulator generates a frequency divider multiplication signal to divide a frequency by a predetermined multiplying factor to output the signal to the fractional N-divider.

According to an exemplary embodiment, the phase locked loop further includes: a second delta-sigma modulator which generates a frequency divider multiplication signal to divide the frequency by a predetermined multiplying factor to output the signal to the phase rotator.

According to an exemplary embodiment, the voltage controlled oscillator (VCO) outputs a fractional-N frequency of the reference frequency.

According to the exemplary embodiment disclosed in the present disclosure, a phase locked loop having a very wide bandwidth may be designed while significantly reducing a phase noise of the delta-signal in a high frequency band.

Accordingly, a fractional-N local oscillator may be used for a high frequency system such as a communication system or a sensor system which requires a high speed, a broad bandwidth, a low noise characteristic, and a small size.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1A:
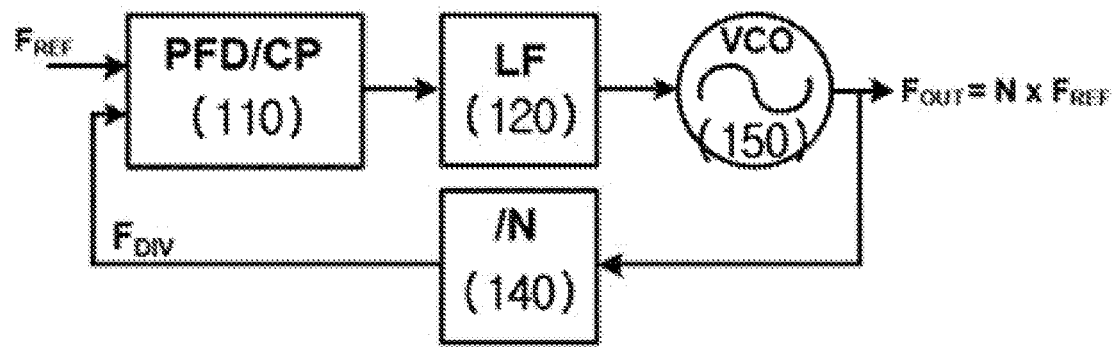
FIG. 1A is a block diagram of an integer-N phase locked loop of the related art.

Those skilled in the art may make various modifications to the present disclosure and the present disclosure may have various embodiments thereof, and thus specific embodiments will be described in detail with reference to the drawings. However, this does not limit the present disclosure within specific exemplary embodiments, and it should be understood that the present disclosure covers all the modifications, equivalents and replacements within the spirit and technical scope of the present disclosure. In the description of respective drawings, similar reference numerals designate similar elements.

Terms such as first, second, A, or B may be used to describe various components but the components are not limited by the above terms. The above terms are used only to distinguish one component from the other component. For example, without departing from the scope of the present disclosure, a first component may be referred to as a second component, and similarly, a second component may be referred to as a first component. A term of and/or includes combination of a plurality of related elements or any one of the plurality of related elements.

Terms used in the present application are used only to describe a specific exemplary embodiment, but are not intended to limit the present disclosure. A singular form may include a plural form if there is no clearly opposite meaning in the context. In the present disclosure, it should be understood that terminology "include" or "have" indicates that a feature, a number, a step, an operation, a component, a part or the combination those of described in the specification is present, but do not exclude a possibility of presence or addition of one or more other features, numbers, steps, operations, components, parts or combinations, in advance.

In the specification and the claim, unless explicitly described to the contrary, the word "comprise" and variations such as "comprises" or "comprising", will be understood to imply the inclusion of stated elements but not the exclusion of any other elements.

Hereinafter, exemplary embodiments according to the present disclosure will be described in detail with reference to accompanying drawings.

Figure 1B:
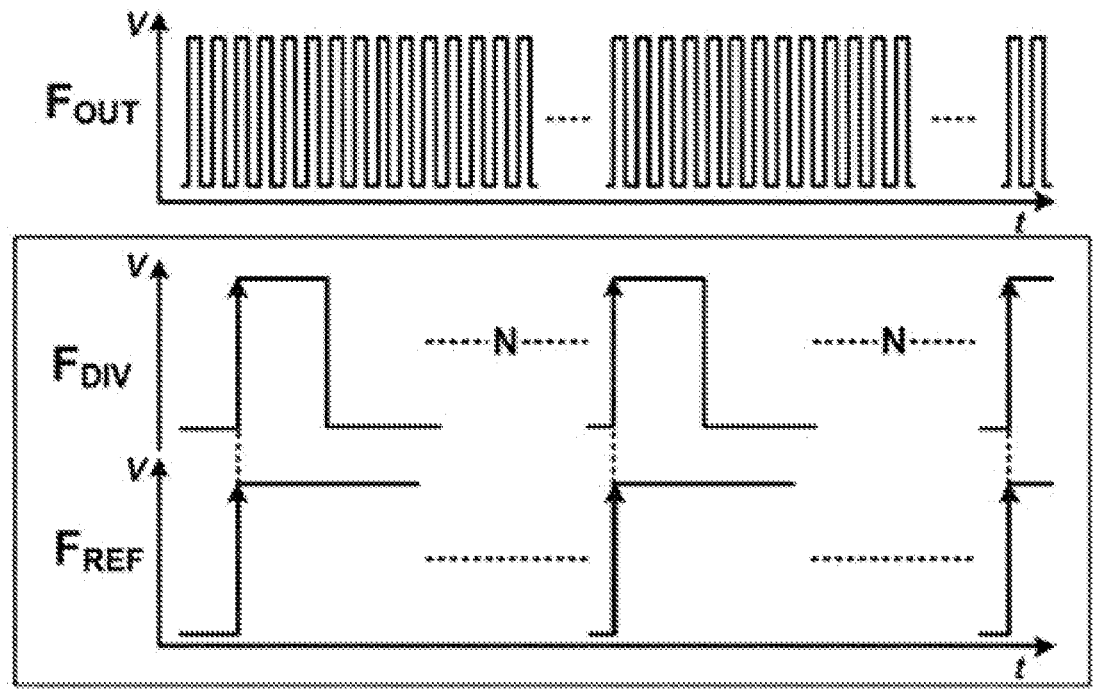
FIG. 1B is a time diagram of an integer-N phase locked loop.

FIG. 1A is a block diagram of a basic integer-N phase locked loop, and FIG. 1B is a time diagram of an integer-N phase locked loop.

Referring to FIG. 1A, an integer-N phase locked loop (PLL) 100 may include a phase frequency detector (PFD)/charge pump (CP) 110, a loop filter (LF) 120, a voltage controlled oscillator (VCO) 130, and an N-divider 140. First, the phase-frequency detector (PFD) compares an output frequency of the N-divider which divides an output of the voltage controlled oscillator 130 by a constant division ratio with a reference frequency to output a signal corresponding to a phase difference in the form of a voltage pulse.

The charge pump CP supplies a current to the loop filter 120 which is a subsequent stage, during a pulse width time. The loop filter 120 changes the current into a voltage to supply the voltage as a voltage control input of the voltage controlled oscillator 130 and the voltage controlled oscillator 130 finally outputs a frequency corresponding thereto.

Referring to FIG. 1B, the integer-N phase locked loop (PLL) 100 outputs a frequency corresponding to N times the reference frequency FREF. The output frequency is fixed by comparing the reference frequency and a divided frequency $F_{DIV}$ obtained by dividing the output frequency FOUT by N.

Figure 2A:
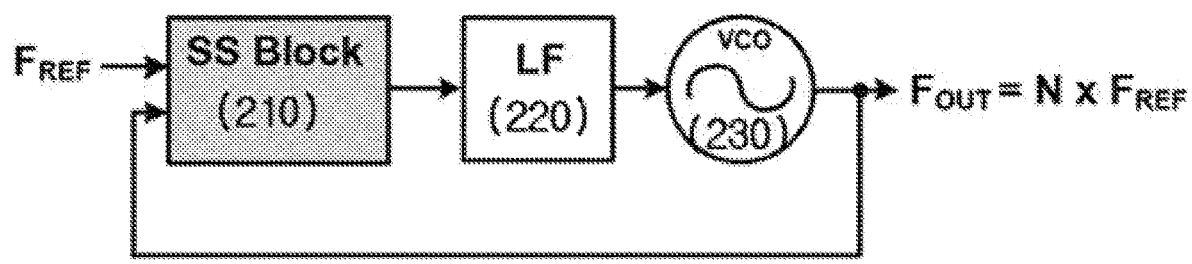
FIG. 2A is a block diagram of a sub-sampling loop of the related art.
Figure 2B:
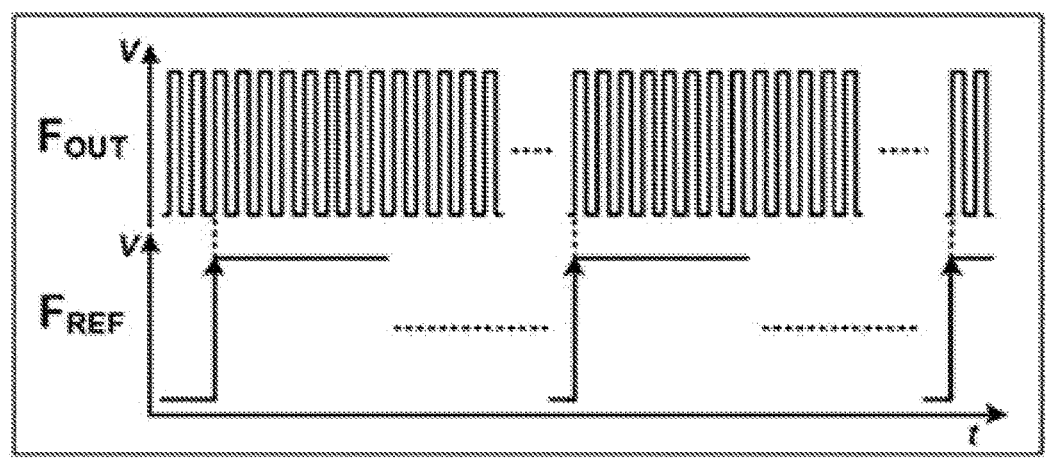
FIG. 2B is a time diagram of a sub-sampling loop.

FIG. 2A is a block diagram of a basic sub-sampling loop, and FIG. 2B is a time diagram of a sub-sampling loop.

Referring to FIG. 2A, the sub-sampling loop 220 includes a sub-sampling block (SSblock) 210, a loop filter (LF) 220, and a voltage controlled oscillator (VCO) 230.

Referring to FIGS. 2A and 2B, the sub-sampling block (SSblock) 210 outputs a frequency corresponding to N times the reference frequency $F_{REF}$ while comparing a fast output frequency and a slow reference frequency, unlike a basic integer-N phase locked loop.

Figure 3:
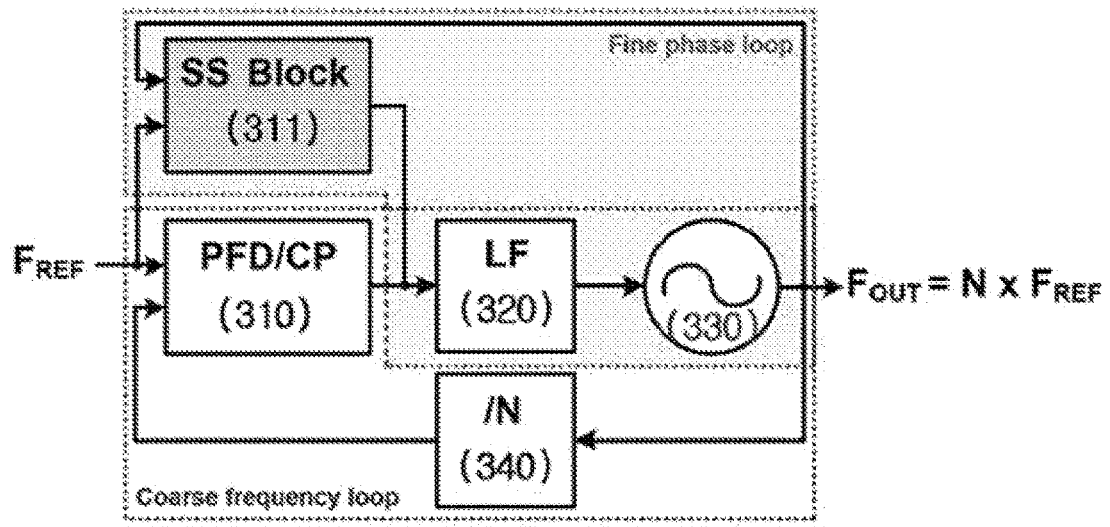
FIG. 3 is a block diagram of a sub-sampling phase locked loop of the related art.

FIG. 3 is a block diagram of a sub-sampling phase locked loop of the related art.

Referring to FIG. 3, a sub-sampling phase locked loop 300 includes a fine phase loop and a coarse frequency loop.

The fine phase loop includes a sub-sampling block (SSblock) 311, a loop filter (LF) 320, and a voltage controlled oscillator (VCO) 330, and the coarse frequency loop may include a phase frequency detector (PFD)/charge pump (CP) 310, the loop filter (LF) 320, the voltage controlled oscillator (VCO) 330, and an N-divider 340.

In order to solve the problem of the sub-sampling loop 200 of FIG. 2 in that the frequency is locked to an arbitrary integer, the sub-sampling phase locked loop 300 of FIG. 3 performs the frequency locking to lock a frequency of the voltage controlled oscillator (VCO) 330 using the coarse frequency loop and then locks the phase using the fine phase loop.

Figure 4:
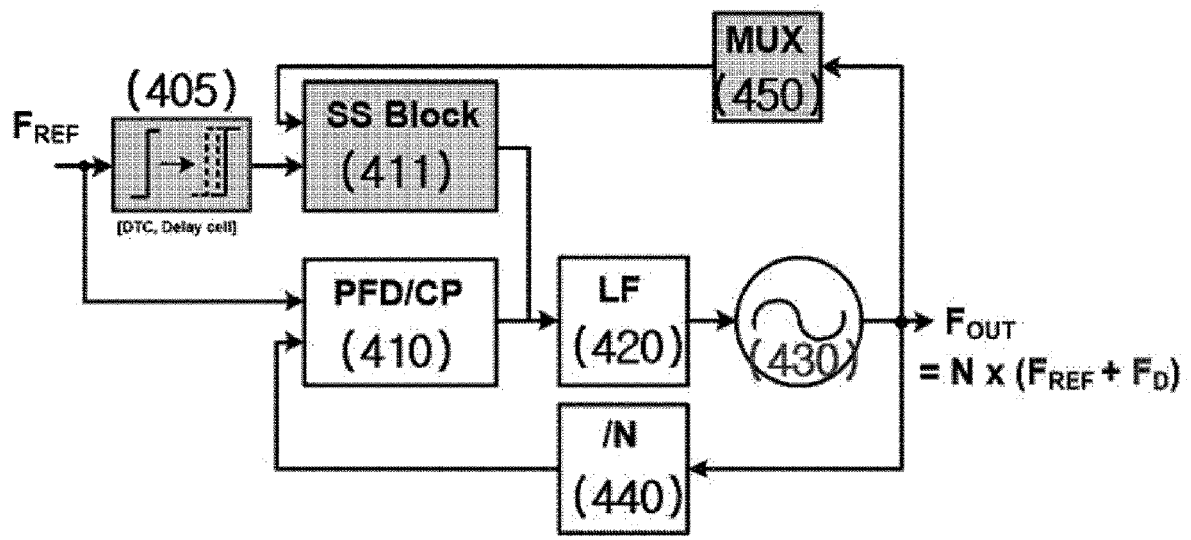
FIG. 4 is a block diagram of a fractional-N sub-sampling phase locked loop of the related art.

FIG. 4 is a block diagram of a fractional-N sub-sampling phase locked loop of the related art.

The fractional-N sub-sampling phase locked loop 400 may include a delay cell (DTC) 405, a sub-sampling block (SSblock) 411, a phase-frequency detector (PFD)/charge pump (CP) 410, a loop filter (LF) 420, a voltage controlled oscillator (VCO) 430, an N-divider 440, and a MUX 450. The delay cell (DTC) 405 employs DTC or DLL to shift the phase.

Figure 5:
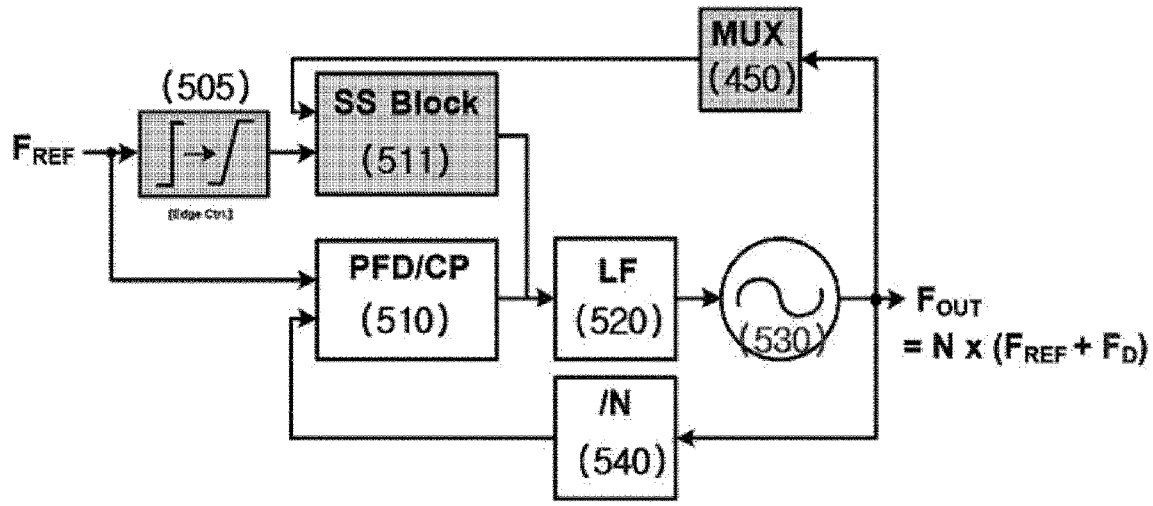
FIG. 5 is a block diagram of a fractional-N sub-sampling phase locked loop of the related art.

FIG. 5 is a block diagram of a fractional-N sub-sampling phase locked loop of the related art.

Referring to FIG. 5, the fractional-N sub-sampling phase locked loop may include an edge control circuit 505, a sub-sampling block (SSblock) 511, a phase-frequency detector (PFD)/charge pump (CP) 510, a loop filter (LF) 520, a voltage controlled oscillator (VCO) 530, an N-divider 540, and a MUX 550. The edge control circuit 505 modifies a gradient of the reference frequency to perform the delay.

Various fractional-N sub-sampling phase locked loops of the related art of FIGS. 3 to 5 configure an integer-N phase locked loop without using a delta-sigma modulator to make an integer-N frequency and then shake a phase of the reference frequency in a subsequent sub-sampling part to make a fractional-N output frequency.

The fractional-N sub-sampling phase locked loop employs a digital-time converter, a delay locked loop, and a simple delay circuit to shift a phase of the reference frequency.

The fractional-N sub-sampling phase locked loop according to various methods of the related art illustrated in FIGS. 3 to 5 has the following common problems.

First, an accuracy of the loop system is lowered. When the delay circuit is used, there is a problem in the accuracy. There is a limitation in finely adjusting a phase of a slow reference frequency.

Second, a frequency locking range is very narrow. That is, an environment to which the system is fixed is not good. The sub-sampling is configured by two loops and two frequencies are different. In the related art, the frequency is locked to an integer multiple and a fractional multiple is applied to an output of the sub-sampling so that the locking range of the circuit is narrow. Even though the phase locked loop is locked, the locked loop is unlocked over the time so that the loop needs to be locked again in some cases.

Third, a noise characteristic is not good. In fact, as seen from the viewpoint of an independent noise, the reference frequency has the relatively best characteristic. The reference frequency generally uses a crystal oscillator. When an output of the crystal oscillator having a good noise characteristic is adjusted using a delay circuit, a total noise is greatly affected.

Hereinafter, a fractional-N sub-sampling phase locked loop using a phase rotator according to an exemplary embodiment of the present disclosure for solving the above-mentioned problems will be described in detail with reference to FIGS. 6 to 9.

Figure 6:
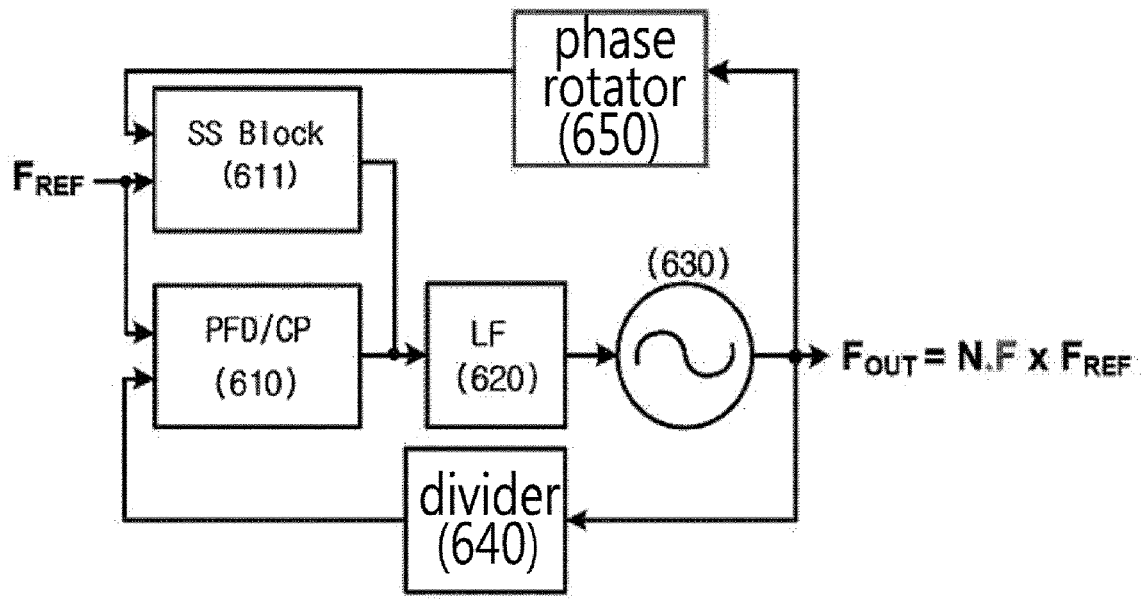
FIG. 6 is a block diagram of a fractional-N sub-sampling phase locked loop using a phase rotator according to an exemplary embodiment of the present disclosure.
Figure 7:
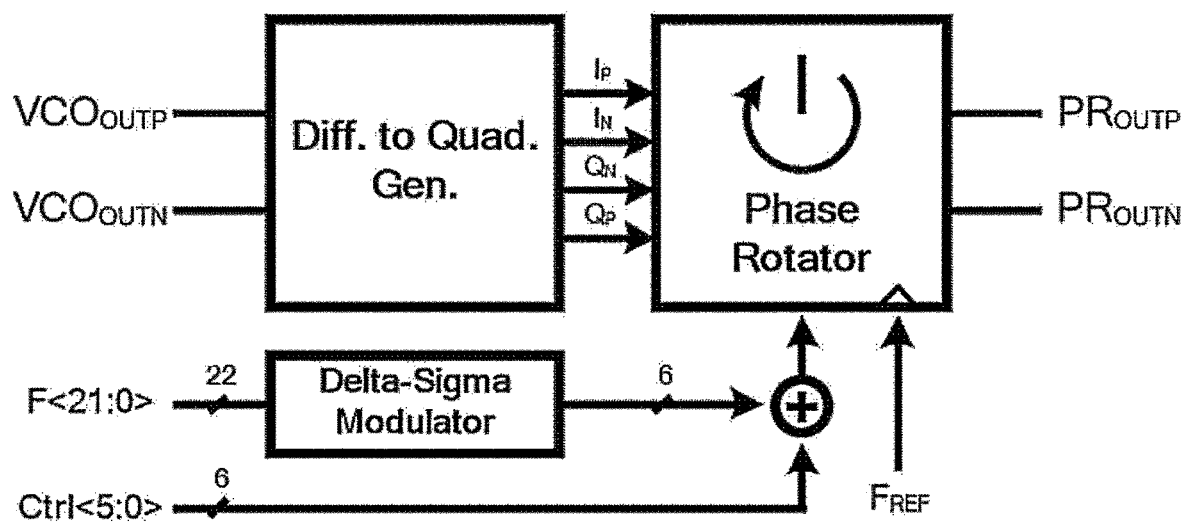
FIG. 7 is a block diagram of a phase rotator according to an exemplary embodiment of the present disclosure.

FIG. 6 is a block diagram of a fractional-N sub-sampling phase locked loop using a phase rotator according to an exemplary embodiment of the present disclosure, and FIG. 7 is a block diagram of a phase rotator according to an exemplary embodiment of the present disclosure.

The fractional-N sub-sampling phase locked loop 600 using a phase rotator includes a sub-sampling block (SS-block) 611, a phase-frequency detector (PFD)/charge pump (CP) 610, a loop filter (LF) 620, a voltage controlled oscillator (VCO) 630, a fractional N-divider 640, and a phase rotator 650.

Here, the phase-frequency detector (PFD)/charge pump (CP) 610, the loop filter (LF) 620, the voltage controlled oscillator (VCO) 630, and the fractional N-divider 640 are a frequency locked loop to be locked to a fractional-N frequency of a signal output from the voltage controlled oscillator (VCO) 630.

To this end, the phase-frequency detector (PFD) generates an up-signal UP and a down-signal DOWN based on a phase difference of an input signal Fref and a feedback signal Fdiv and the charge pump (CP) 610 generates a charge pump output signal based on the up-signal UP and the down-signal DOWN output from the phase-frequency detector (PFD).

The loop filter (LF) 620 changes the charge pump output signal output from the charge pump CP into a voltage to input the voltage to the voltage controlled oscillator (VCO) 630.

The fractional N-divider 640 generates the feedback signal Fdiv by applying a fractional multiple to an output of the voltage controlled oscillator (VCO) 630. The generated feedback signal Fdiv is input to the phase-frequency detector (PFD).

In the meantime, the SSblock (sub-sampling block) 611, the loop filter (LF) 620, the voltage controlled oscillator (VCO) 630, and the phase rotator 650 operate as a phase locked loop which locks the phase. To this end, the SSblock (sub-sampling block) 611 samples a fast oscillator output signal into a slow input signal based on an input signal and a feedback signal output through the phase rotator 650 and then calculates a phase difference from the input signal as a DC value and converts the DC value into a voltage using the loop filter (LF) 620 to input the voltage to the voltage controlled oscillator (VCO) 630.

By doing this, a fractional-N frequency of the reference frequency output from the voltage controlled oscillator (VCO) 630 is output.

Here, the phase rotator 650 is a circuit which receives information of the output frequency of a system as an input and shifts a phase of the frequency. As illustrated in FIG. 7, the phase rotator 650 receives a signal with a phase difference of 90° from the oscillator 630 and divides the frequency by a predetermined multiplying factor according to a frequency divider multiplication signal output from the delta-signal modulator to generate an output with a phase which varies in 0 to 360 degrees.

The noise characteristic varies depending on how much the phase rotator 650 divides and shifts the phase. The more the phase is divided and shifted, the more the delta-sigma noise is deteriorated.

Accordingly, the fractional-N sub-sampling phase locked loop using a phase rotator according to an exemplary embodiment of the present disclosure has a good phase noise characteristic. The influence by the delta-sigma noise may be reduced at a higher frequency with respect to the carrier frequency, so that a broad bandwidth may be designed and the entire circuit size may be reduced.

Further, unlike the fractional-N sub-sampling phase locked loop of the related art which slowly moves the reference frequency, the fast output frequency is finely adjusted so that the resolution is high.

A detailed configuration of FIG. 6 will be described with reference to FIG. 8.

Figure 8:
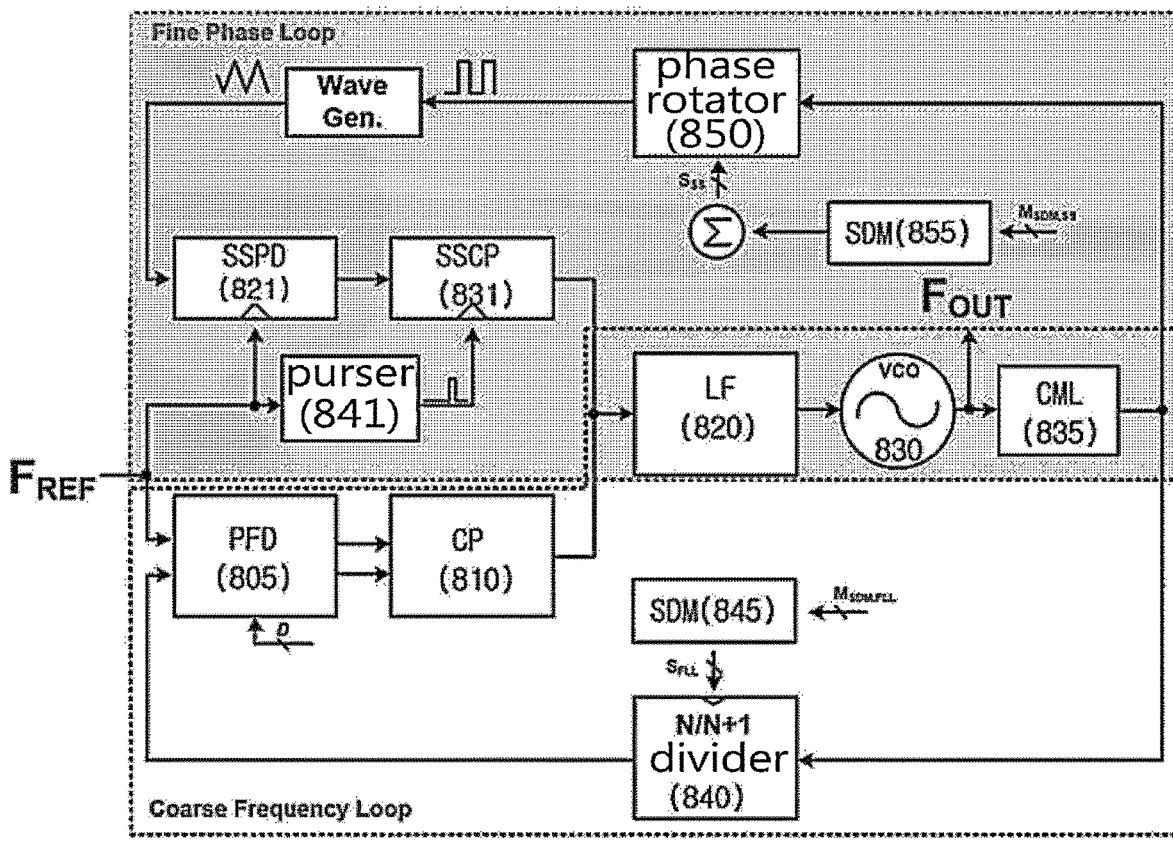
FIG. 8 is a detailed block diagram of a fractional-N sub-sampling phase locked loop using a phase rotator according to an exemplary embodiment of the present disclosure.

FIG. 8 is a detailed block diagram of a fractional-N sub-sampling phase locked loop using a phase rotator according to an exemplary embodiment of the present disclosure.

The fractional-N sub-sampling phase locked loop 800 using a phase rotator includes a frequency locked loop (coarse frequency loop) which locks a frequency to a fractional-N frequency using a first delta-sigma modulator and a sub-sampling phase locked loop (fine phase loop) which locks a phase to a fractional multiple using a phase rotator.

The frequency locked loop (coarse frequency loop) includes a phase-frequency detector (PFD) 805, a charge pump (CP) 810, a loop filter (LF) 820, a voltage controlled oscillator (VCO) 830, a current mode logic 835, a fractional N-divider 840, and a first delta-sigma modulator 845.

The phase-frequency detector (PFD) 805, the charge pump (CP) 810, the loop filter (LF) 820, the voltage controlled oscillator (VCO) 830, the current mode logic 835, and the fractional N-divider 840 are the same components as the phase-frequency detector/charge pump (PFD/CP) 610, the loop filter (LF) 620, the voltage controlled oscillator (VCO) 630, and the fractional N-divider 640 of FIG. 6 so that a detailed description will be omitted.

The current mode logic 835 serves to lower a high output frequency output from the voltage controlled oscillator (VCO). An output signal of the current mode logic 835 is input to the fractional N-divider 840. The fractional N-divider 840 enables N and N+1.

The first delta-sigma modulator 845 generates a frequency divider multiplication signal to lock a frequency of the fractional N-divider 840 at a desired fractional multiple and input to the phase-frequency detector and charge pump (PFD/CP) 810.

The phase locked loop includes a sub-sampling phase detector (SSPD) 821, a sub-sampling charge pump (SSCP) 831, and a pulser 841 and further includes a loop filter (LF) 820, a voltage controlled oscillator (VCO) 830, a current mode logic 835, a phase rotator 850, and a second delta-sigma modulator 855. Here, the sub-sampling phase detector (SSPD) 821, the sub-sampling charge pump (SSCP) 831, and the pulser 841 are components of SSblock. Here, the loop filter (LF) 820, the voltage controlled oscillator (VCO) 830, and the current mode logic 835 are shared with the frequency locked loop.

The loop filter (LF) 820, the voltage controlled oscillator (VCO) 830, and the phase rotator 850 are the same components as the loop filter (LF) 620, the voltage controlled oscillator (VCO) 630, and the phase rotator 650 of FIG. 6 so that a detailed description will be omitted.

The SSPD 821 samples a fast oscillator output signal into a slow input signal and then calculates a phase difference from the input signal as a DC value based on an input signal Fref and a signal divided from the phase rotator, and the SSCP 831 converts the phase difference of the DC calculated in the SSPD 821 to transmit the converted value to the voltage controlled oscillator 830. In the meantime, the pulser 841 controls the operating time of the SSCP 831 to adjust a loop gain.

The loop filter (LF) 820 adjusts a voltage value to lock the frequency and the phase.

The second sigma-delta modulator 855 generates a frequency divider multiplication signal to input the signal to the phase rotator 850. The association with a fractional-N frequency is performed by the second sigma-delta modulator 855.

According to the exemplary embodiment, even though the delta-sigma modulator is used, the phase rotator may reduce the phase noise of the delta-sigma modulator by a number of bits of 2.

Even though the fractional-N sub-sampling phase locked loop using a phase rotator according to the exemplary embodiment of the present disclosure is configured by two loops which set a frequency and a phase, like the fractional N sub-sampling phase locked loop of the related art, in the loop which sets the frequency first, the first sigma-delta modulator 845 is added to the divider 840 to lock the frequency to the fractional-N frequency. Further, in the loop which sets the phase, the phase rotator 850 is configured at an output frequency (fast frequency) to shift the phase of the output frequency and then compare with the reference frequency.

Figure 9:
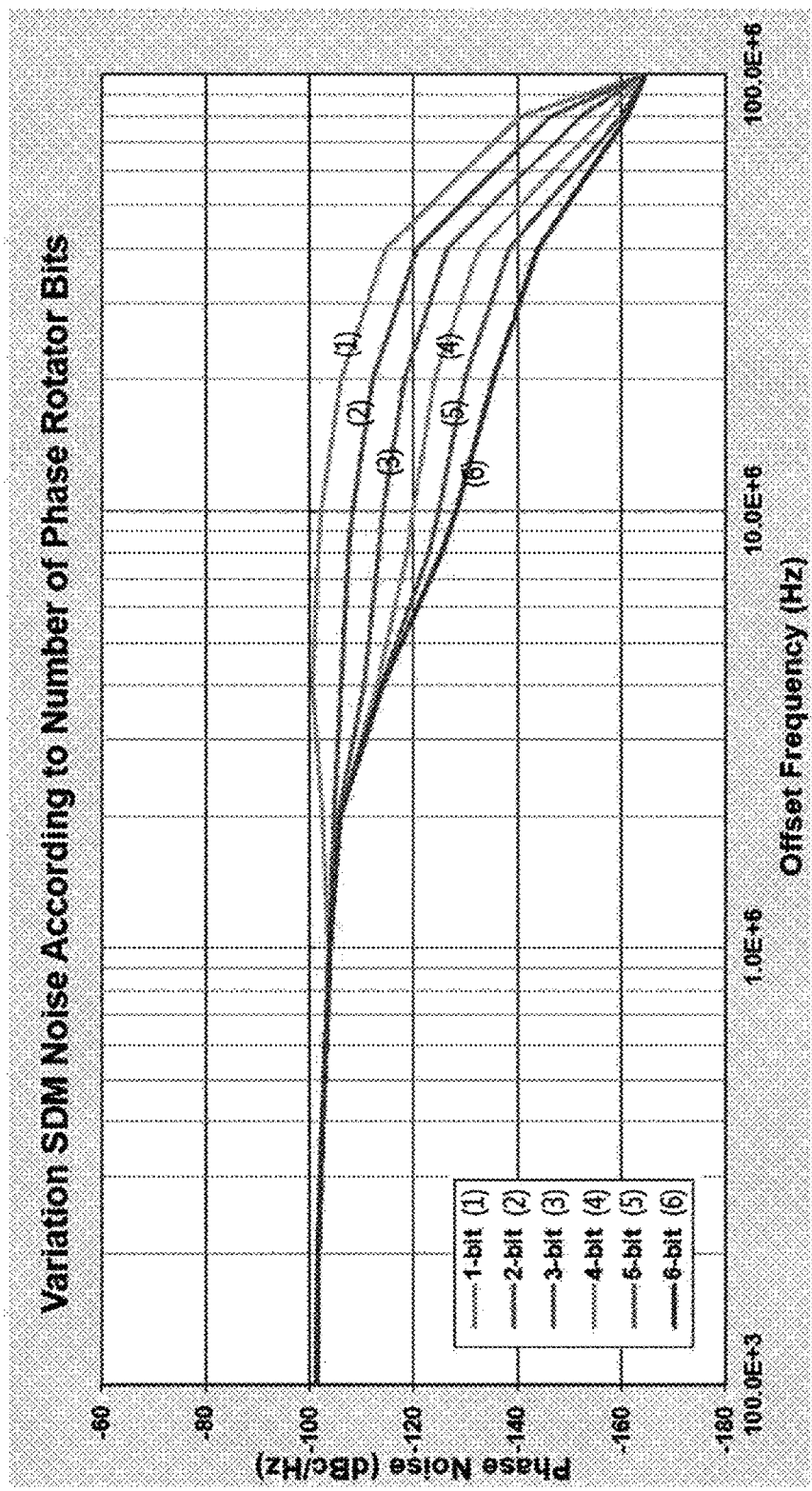
FIG. 9 is a graph illustrating a simulation result according to an exemplary embodiment of the present disclosure.

FIG. 9 is a graph illustrating a simulation result according to an exemplary embodiment of the present disclosure.

For the simulation according to the exemplary embodiment of the present disclosure, 28 GHz phase locked loop was designed and a bandwidth was designed to be 4 MHz using a CMOS TSMC 65-nm process.

A reference frequency was 10 MHz, a carrier frequency was 24 GHz, and an output frequency was 28 GHz.

The phase noise in the bandwidth was −112 dBc/Hz at both 100 kHz and 1 MHz.

According to the exemplary embodiment of the present disclosure, a phase locked loop with a very broad bandwidth may be designed while significantly reducing the phase noise in the high frequency band.

Accordingly, a fractional-N local oscillator may be used for a high frequency system such as a communication system or a sensor system which requires a high speed, a broad bandwidth, a low noise characteristic, and a small size.

It will be appreciated that various exemplary embodiments of the present disclosure have been described herein for purposes of illustration, and that various modifications, changes, and substitutions may be made by those skilled in the art without departing from the scope and spirit of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. A fractional-N sub-sampling phase locked loop using a phase rotator, comprising: a frequency locked loop which is locked at a fractional N frequency using a first delta-signal modulator; and a sub-sampling phase locked loop which locks a phase to a fractional-N phase using a phase rotator, wherein the phase rotator applies a fractional multiple to a phase of a signal output from an oscillator, and wherein the phase locked loop includes: a sub-sampling block (SSblock) which samples a fast oscillator output signal into a slow input signal and then calculates a phase difference from the input signal based on the input signal (Fref) and a signal divided from the phase rotator; a loop filter (LF) which changes the charge pump output signal into a voltage; and a voltage controlled oscillator (VCO) which receives an output of the loop filter (LF).

2. The fractional-N sub-sampling phase locked loop according to claim 1, wherein the frequency locked loop includes:
   a phase-frequency detector (PFD) which generates an up-signal (UP) and a down-signal (DOWN) based on a phase difference between an input signal (Fref) and a feedback signal (Fdiv);
   a charge pump (CP) which generates a charge pump output signal based on the up-signal (UP) and the down-signal (DOWN);
   a loop filter (LF) which changes the charge pump output signal into a voltage;
   a voltage controlled oscillator (VCO) which receives an output of the loop filter (LF); and
   a fractional N-divider which applies a fractional multiple to an output of the voltage controlled oscillator (VCO) to output a feedback signal (Fdiv).

3. The fractional-N sub-sampling phase locked loop according to claim 1, wherein the sub-sampling block (SSblock) includes:
   a sub-sampling phase detector (SSPD) which samples a fast oscillator output signal into a slow input signal and then calculates a phase difference from the input signal as a DC value based on the input signal (Fref) and a signal divided from the phase rotator;
   a sub-sampling charge pump (SSCP) which converts a phase difference of the DC calculated from the sub-sampling phase detector to transmit the phase difference to the voltage controlled oscillator; and
   a pulser which controls an operating time of the sub-sampling charge pump to adjust a roof gain.

4. The fractional-N sub-sampling phase locked loop according to claim 1, wherein the phase locked loop and the frequency locked loop commonly include a current mode logic (CML) to lower an output frequency of the voltage controlled oscillator (VCO).

5. The fractional-N sub-sampling phase locked loop according to claim 2, wherein the first delta-sigma modulator generates a frequency divider multiplication signal to divide a frequency by a predetermined multiplying factor to output the signal to the fractional N-divider.

6. The fractional-N sub-sampling phase locked loop according to claim 5, wherein the phase locked loop further includes:
- a second delta-sigma modulator which generates a frequency divider multiplication signal to divide the frequency by a predetermined multiplying factor to output the signal to the phase rotator.

7. The fractional-N sub-sampling phase locked loop according to claim 1, wherein the voltage controlled oscillator (VCO) outputs a fractional-N frequency of the reference frequency.

* * * * *